(12) United States Patent
Furuie

(10) Patent No.: US 10,854,828 B2
(45) Date of Patent: Dec. 1, 2020

(54) DISPLAY DEVICE INCLUDING A BENT PORTION AND METHOD FOR MANUFACTURING THE SAME

(71) Applicant: Japan Display Inc., Minato-ku (JP)

(72) Inventor: Masamitsu Furuie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/001,141

(22) Filed: Jun. 6, 2018

(65) Prior Publication Data
US 2018/0366663 A1    Dec. 20, 2018

(30) Foreign Application Priority Data

Jun. 16, 2017 (JP) ................................. 2017-118637

(51) Int. Cl.
*H01L 51/00* (2006.01)
*H01L 51/52* (2006.01)
*H01L 51/56* (2006.01)

(52) U.S. Cl.
CPC ...... *H01L 51/0097* (2013.01); *H01L 51/5218* (2013.01); *H01L 51/5221* (2013.01); *H01L 51/5237* (2013.01); *H01L 51/5246* (2013.01); *H01L 51/56* (2013.01)

(58) Field of Classification Search
None
See application file for complete search history.

(56) References Cited

U.S. PATENT DOCUMENTS

| 9,425,418 | B2* | 8/2016 | Kwon | H01L 27/3276 |
| 2014/0254111 | A1* | 9/2014 | Yamazaki | H01L 51/0097 361/749 |
| 2015/0036269 | A1* | 2/2015 | Kim | H01L 51/5246 361/679.01 |
| 2016/0009956 | A1* | 1/2016 | Hwang | C09J 133/08 428/41.8 |
| 2016/0181346 | A1* | 6/2016 | Kwon | H01L 27/3276 257/40 |
| 2017/0075444 | A1* | 3/2017 | Nade | G06F 3/041 |
| 2017/0262109 | A1* | 9/2017 | Choi | G06F 3/0412 |
| 2017/0294495 | A1* | 10/2017 | Shyu | G06F 3/041 |
| 2019/0140202 | A1* | 5/2019 | Jin | H01L 51/0097 |

FOREIGN PATENT DOCUMENTS

JP    2011-209405    10/2011

* cited by examiner

*Primary Examiner* — David D Davis
(74) *Attorney, Agent, or Firm* — Oblon, McClelland, Maier & Neustadt, L.L.P.

(57) ABSTRACT

A display device includes a flexible substrate including a display area on which a plurality of pixels are disposed, a flexible film, and a photo-curable adhesive member for bonding the flexible substrate and the flexible film together. The photo-curable adhesive member includes a soft area and a cured area having higher hardness than the soft area.

20 Claims, 15 Drawing Sheets

DISPLAY DEVICE INCLUDING A BENT PORTION AND METHOD FOR MANUFACTURING THE SAME

CROSS-REFERENCE TO RELATED APPLICATION

The present application claims priority from Japanese application JP2017-118637 filed on Jun. 16, 2017, the content of which is hereby incorporated by reference into this application.

BACKGROUND OF THE INVENTION

1. Field of the Invention

The present invention relates to a display device and a method for manufacturing the display device.

2. Description of the Related Art

Display devices having a flexible substrate have been known. Such display devices reduce a frame size by bending areas around a display area and disposing a terminal area, on which electronic components are mounted, on the back side of the display area (e.g., JP2011-209405A). A flexible substrate is thin, soft, and of low strength, and thus, for example, a reinforcing film needs to be attached to the backside of the flexible substrate. The flexible substrate and the reinforcing film may be adhered to each other by an adhesive agent or an adhesive sheet, for example.

SUMMARY OF THE INVENTION

If the stiffness of the adhesive member for bonding the flexible substrate and the reinforcing film together is low, the electronic components on the terminal area of the flexible substrate may be improperly mounted. The di splay device disclosed in JP2011-209405A additionally needs an adhesive agent in order to keep a bent state of the flexible substrate, which results in increase in the number of the components and complicated manufacturing process.

One or more embodiments of the present invention have been conceived in view of the above, and an object thereof is to prevent an electronic component from being improperly mounted on a flexible substrate. Another object of the present invention is to easily keeping a bent state of the flexible substrate.

A display device according to an aspect of the present invention includes a flexible substrate including a display area on which a plurality of pixels are disposed, a flexible film, and a photo-curable adhesive member for bonding the flexible substrate and the flexible film together. The photo-curable adhesive member includes a soft area and a cured area having higher hardness than the soft area.

A method for manufacturing a display device according to an aspect of the present invention includes steps of bonding a flexible substrate and a flexible film together by a photo-curable adhesive member, where the flexible substrate including a display area, and curing a part of the photo-curable adhesive member by irradiating light.

DETAILED DESCRIPTION OF THE INVENTION

Embodiments of the present invention will be described below in detail with reference to the accompanying drawings. However, the present invention is not to be limited to the embodiments described below, and can be changed as appropriate without departing from the spirit of the invention.

The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the detailed description of the invention, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

Figure 1:
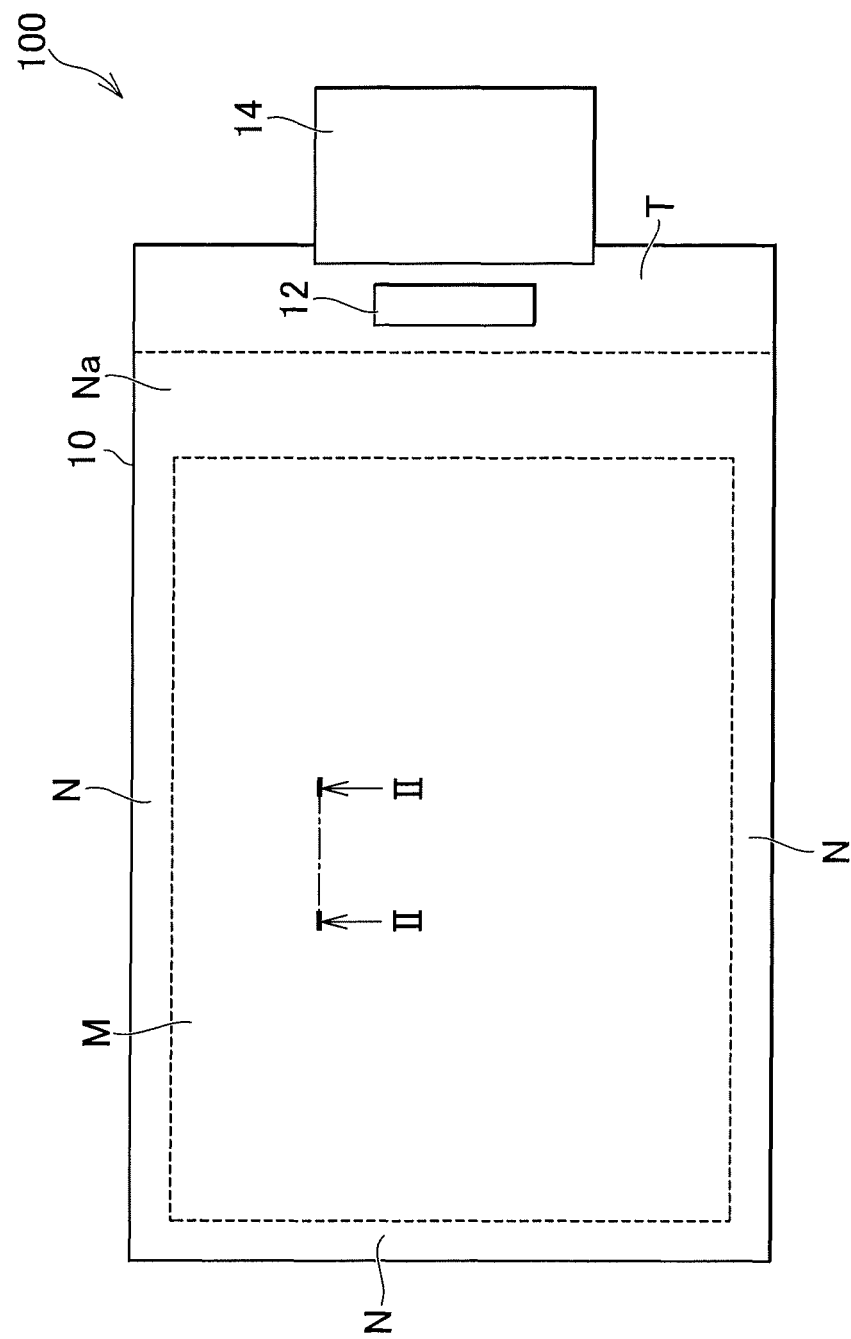
FIG. 1 is a plan view of a display device in a deployed state according to a first embodiment.
Figure 2:
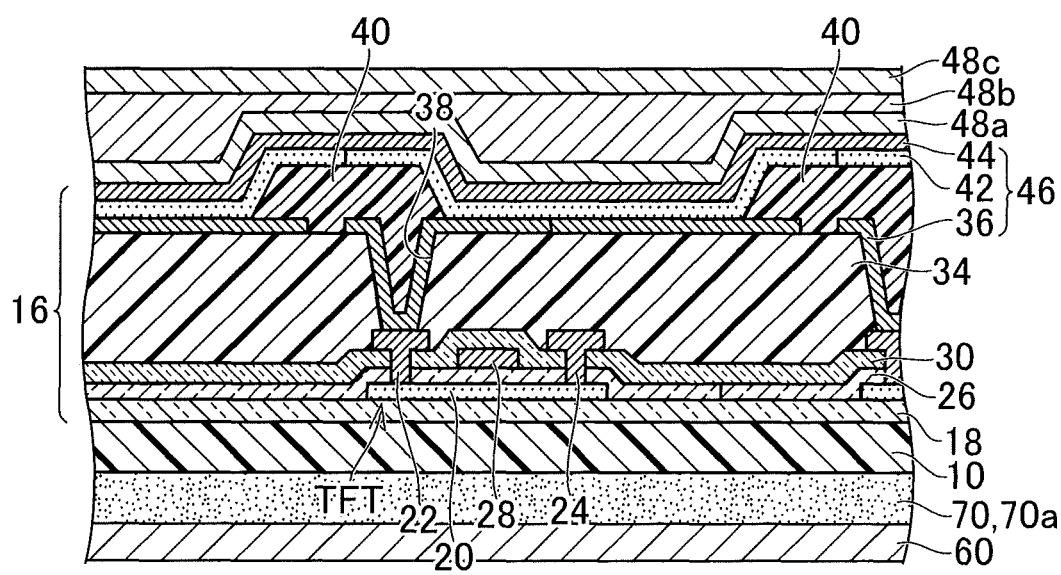
FIG. 2 is a cross-sectional view of a laminate structure of a display area taken along the line II-II in FIG. 1.

FIG. 1 is a plan view of the display device in a deployed state according to first embodiment. FIG. 2 is a cross-sectional view of the laminate structure of the display area taken along the line II-II in FIG. 1. In the first embodiment, an organic electroluminescent display device is taken as an example of the display device 100. The display device 100 has pixels in multiple colors, such as red, green, and blue, and displays full-color images.

The display device 100 includes a flexible substrate 10 having a rectangle shape, for example. The flexible substrate 10 is a substrate that is flexible, and made of polyimide resin and polyethylene terephthalate, for example. The flexible substrate 10 includes a display area M on which a plurality of pixels are disposed in a matrix. The flexible substrate 10 also includes a frame area N surrounding four sides of the display area M. Further, the flexible substrate 10 includes a terminal area T on which electronic components, such as an integrated circuit chip 12 for driving an element that displays an image and a flexible printed circuit substrate 14, are mounted. In the following, an area included in the frame area N and disposed between the display area M and the terminal area T is referred to as a frame area Na.

Referring to FIG. 2, details of the laminate structure of the display area M will be described. A display circuit layer 16 composed of a plurality of layers is laminated on the flexible substrate 10. The display circuit layer 16 includes an undercoat layer 18 that serves as a barrier to impurities included in the flexible substrate 10 and to moisture and oxygen in the air. The undercoat layer 18 may include inorganic insulating material such as silicone oxide and silicon nitride, or may be a laminate structure of these materials. A semiconductor layer 20 is formed on the undercoat layer 18. A source electrode 22 and a drain electrode 24 are electrically connected to the semiconductor layer 20, and a gate insulating film 26 is formed so as to cover the semiconductor layer 20. The gate insulating film 26 may also include inorganic insulating material. A gate electrode 28 is formed on the gate insulating film 26, and an insulating interlayer 30 is formed so as to cover the gate electrode 28. The insulating interlayer 30 is also made of inorganic material. The source electrode 22 and the drain electrode 24 penetrate the gate insulating film 26 and the insulating interlayer 30. The semiconductor layer 20, the source electrode 22, the drain electrode 24, and the gate electrode 28 form at least a part of a thin film transistor (TFT).

A flattening layer 34 is disposed on the TFT. On the flattening layer 34, a plurality of pixel electrodes 36 (e.g., anodes) are disposed so as to respectively correspond to the pixels. In a case where the emitted light is output from the side opposite to the flexible substrate 10 as described later, the pixel electrodes 36 may include material of high reflectivity, for example, metal such as silver, aluminium, and magnesium. Further, a film including a conductive material having light-transmitting property, such as ITO and IZO, may be formed on the layer of high reflectivity. The flattening layer 34 may be formed of an organic insulator so as to be flat at least on the surface on which the pixel electrodes 36 are provided. The flattening layer 34 may be made of organic material, such as photosensitive acrylic resin. The pixel electrode 36 are electrically connected to one of the source electrode 22 and the drain electrode 24 on the semiconductor layer 20 via a contact hole 38 penetrating the flattening layer 34.

An insulating layer (bank) 40 for dividing the pixels are formed on the flattening layer 34 and the pixel electrode 36. The insulating layer 40 is formed so as to cover the end portion of the pixel electrode 36.

An organic electroluminescence layer 42 is disposed on the pixel electrode 36 and the insulating layer 40. Each organic electroluminescence layer 42 is separately provided for a pixel electrode 36, and emits blue, red, or green light corresponding to each pixel. The colors corresponding to the pixels are not limited to those listed above, but may additionally include yellow or white, for example. In a case where a color filter layer is provided, for example, the organic electroluminescence layer 42 may be provided across adjacent pixels.

A common electrode 44 (e.g., cathode) is disposed on the organic electroluminescence layer 42. The common electrode 44 is continuously formed over the adjacent pixel electrodes 36. The organic electroluminescence layer 42 is disposed between the pixel electrodes 36 and the common electrode 44, and emits light while being controlled in brightness by an electric current that flows therebetween. In a case where the emitted light is output from the side opposite to the flexible substrate 10, the common electrode 44 is made of conductive material having light-transmitting property, such as ITO and IZO.

The organic electroluminescence layer 42 includes at least a light-emitting layer, and may include a hole transport layer, a hole injection layer, an electron transport layer, and an electron injection layer, for example. A pixel electrode 36, an evaporated organic electroluminescence film 42, and a common electrode 44 form at least a part of a light-emitting element 46.

A sealing film is disposed on the light-emitting element 46 so as to protect the light-emitting element 46 from moisture. The sealing film is formed by laminating an inorganic film 48a made of SiN and SiOx etc., an organic film 48b made of acrylic resin etc. and an inorganic film 48c made of SiN and SiOx, etc. The structure of the sealing film is not limited to this, but may be formed of a single inorganic film, or two or more layers different from the layers indicated in FIG. 2 in the number of layers or the order of layers.

A reinforcing film 60 is adhered to the back side of the flexible substrate 10 by using a photo-curable adhesive sheet 70 in order to strengthen the flexible substrate 10. In the first embodiment, the back side of the flexible substrate 10 indicates the side opposite to the side on which the display circuit layer 16 is disposed. The reinforcing film 60 may be made of polyethylene terephthalate, for example, and have a thickness of about 50 µm.

In the first embodiment, a sheet having photo-curability is used as the photo-curable adhesive sheet 70. In particular, a film that hardens by a crosslinking reaction with ultraviolet rays is used as the photo-curable adhesive sheet 70. In the following, on the photo-curable adhesive sheet 70, an area that is not irradiated with ultraviolet rays is a soft area 70a, and an area that is irradiated with ultraviolet rays and cured is a cured area 70b. The cured area 70b has higher stiffness, modulus of elasticity, and adhesiveness than the soft area 70a.

The photo-curable adhesive sheet 70 may be made of material having a modulus of elasticity of about 0.01 to 0.1 MPa in the soft area 70a before being cured, and about 10 to several hundred MPa in the cured area 70b after being cured. The photo-curable adhesive sheet 70 may have a thickness of 50 µm or more, preferably 100 µm or more.

When the photo-curable adhesive sheet 70 is thicker, the photo-curable adhesive sheet 70 exhibits higher shape retention capacity.

Figure 3:
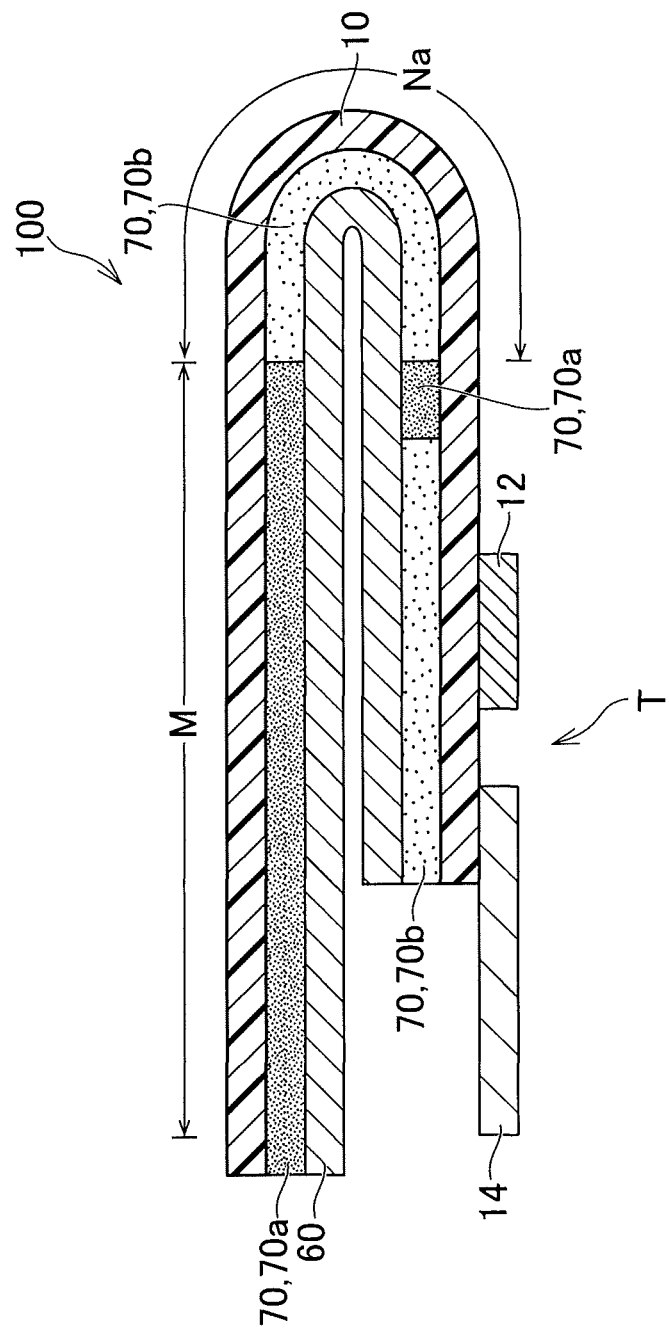
FIG. 3 is a schematic sectional view of the display device according to the first embodiment illustrating an overall configuration of the display device.

FIG. 3 is a schematic sectional view of the display device according to the first embodiment illustrating the overall configuration of the display device. To simplify FIG. 3, the laminate structure on the flexible substrate 10 as described referring to FIG. 2 is omitted.

As shown in FIG. 3, the display device 100 according to the first embodiment is formed by bonding the reinforcing film 60 and the flexible substrate 10 together by the photo-curable adhesive sheet 70. The flexible substrate 10 is bent so that the terminal area T is positioned at the back side of the display area M. The reinforcing film 60 and the photo-curable adhesive sheet 70 are also bent with bending of the flexible substrate 10. With this configuration, the frame area can be narrowed.

The photo-curable adhesive sheet 70 includes the soft area 70a and the cured area 70b having higher stiffness than the soft area 70a. The cured area 70b is formed at an area (first cured area) where the photo-curable adhesive sheet 70 overlaps the bent area of the flexible substrate 10, and an area (second cured area) where the photo-curable adhesive sheet 70 overlaps the terminal area T of the flexible substrate 10.

In the display device 100, the cured area 70b having higher stiffness is formed at a position that overlaps the terminal area T. This can stabilize the attitude of the electronic components mounted on the terminal area T, and thus reduce the possibility of improper mounting. Further, the cured area 70b having high stiffness is formed at the bent area, and thus the bent state of the flexible substrate 10 can be kept without using additional adhesive member, for example.

Next, referring to FIGS. 4 to 7, manufacturing process of the display device 100 according to the first embodiment will be described. FIGS. 4 to 7 are schematic sectional views for explaining the manufacturing process of the display device according to the first embodiment.

First, the flexible substrate 10 and the reinforcing film 60 are adhered to each other by the photo-curable adhesive sheet 70. At this time, the entire photo-curable adhesive sheet 70 is preferably a soft area 70a.

Figure 4:
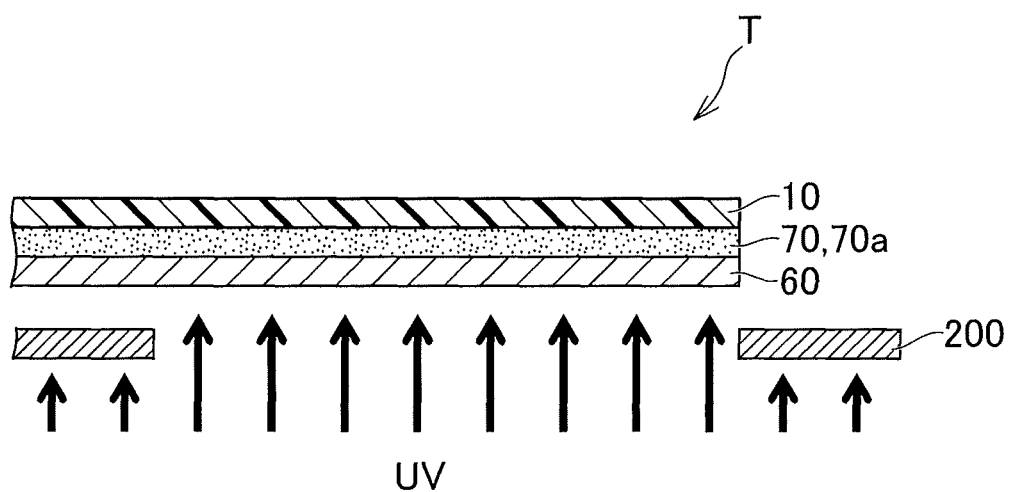
FIG. 4 is a schematic sectional view of the display device according to the first embodiment for explaining manufacturing process of the display device.
Figure 5:
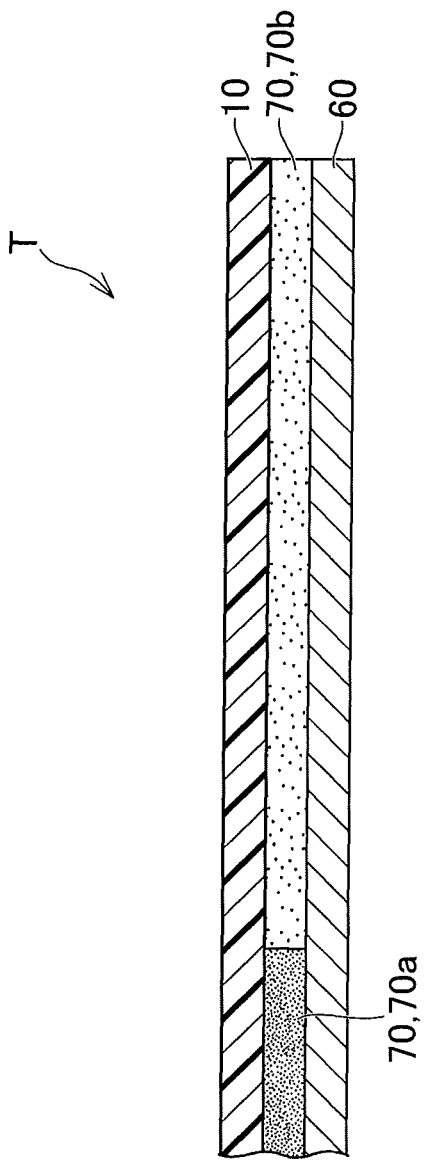
FIG. 5 is a schematic sectional view of the display device according to the first embodiment for explaining manufacturing process of the display device.

Subsequently, as shown in FIG. 4, the photo-curable adhesive sheet 70 is irradiated with ultraviolet rays (UV) from the back side of the flexible substrate 10. At this time, using a mask 200, ultraviolet rays may be irradiated only to an area where the photo-curable adhesive sheet 70 overlaps the terminal area T of the flexible substrate 10. In this way, the area where the photo-curable adhesive sheet 70 overlaps the terminal area T of the flexible substrate 10 is cured, and the cured area 70b is formed as shown in FIG. 5.

Figure 6:
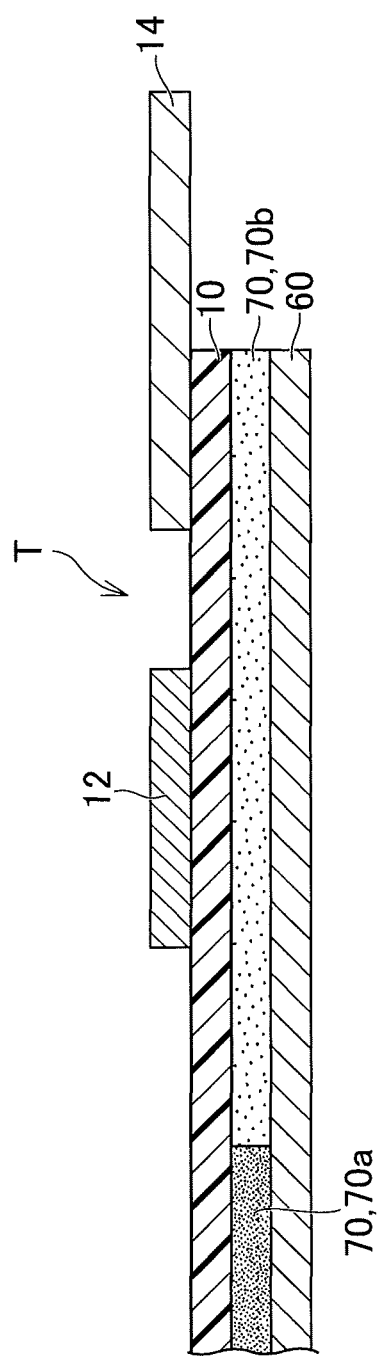
FIG. 6 is a schematic sectional view of the display device according to the first embodiment for explaining manufacturing process of the display device.

As shown in FIG. 6, electronic components, such as an integrated circuit chip 12 and a flexible printed circuit substrate 14, are mounted on the terminal area T of the flexible substrate 10. When the electronic components are mounted on the terminal area T, physical pressure needs to be applied to the flexible substrate 10. In this regard, if the stiffness of the adhesive member used to bond the flexible substrate 10 and the reinforcing film 60 together is low, the attitude of the electronic components may be unstable and cause improper mounting. In the first embodiment, the photo-curable adhesive sheet 70 is cured at the area overlapping the area on which the electronic components are mounted, and the cured area 70b having high stiffness is thereby formed. As such, even if the physical pressure is applied when the electronic components are mounted, the electronic components can keep stable attitude. With this configuration, improper mounting of the electronic components unlikely occurs.

Figure 7:
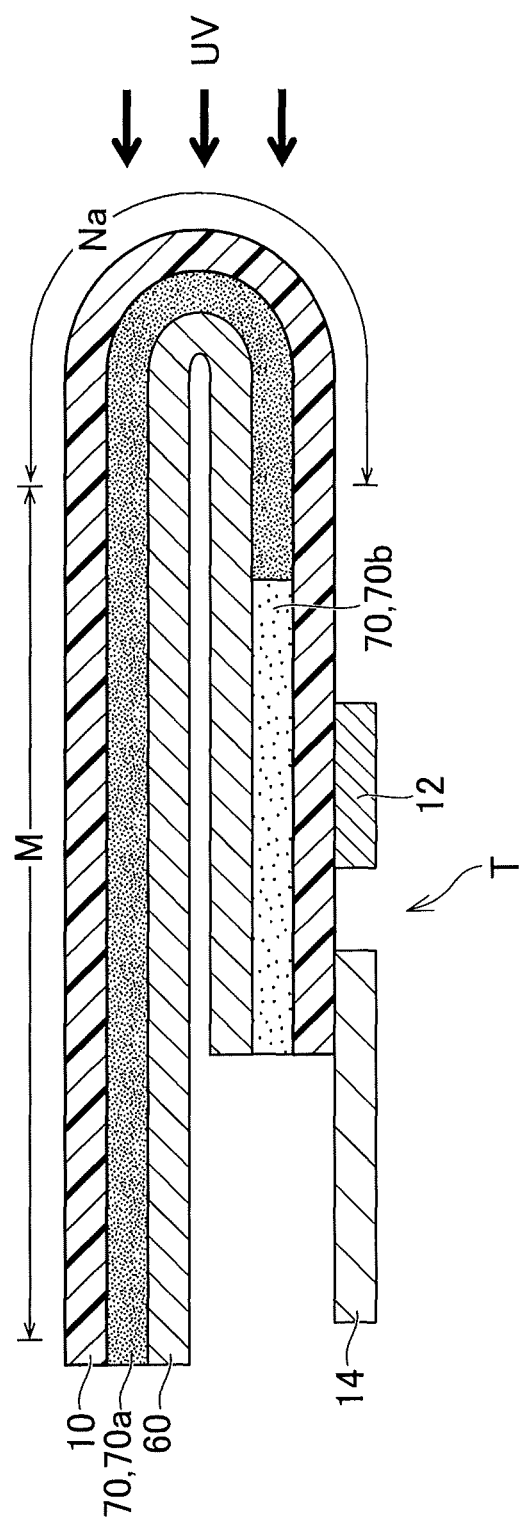
FIG. 7 is a schematic sectional view of the display device according to the first embodiment for explaining manufacturing process of the display device.

The frame area Na of the flexible substrate 10 between the display area M and the terminal area T is bent so that the terminal area T of the flexible substrate 10 is positioned at the backside of the display area M. At this time, the reinforcing film 60 and the photo-curable adhesive sheet 70 are also bent with bending of the flexible substrate 10. As shown in FIG. 7, the bent area is irradiated with ultraviolet rays. In this regard, a mask 200 may be used as indicated in FIG. 4. The flexible substrate 10 and the laminate structure thereon may preferably have UV-transmitting properties on the UV-irradiated area except for the wiring, such as signal lines, extending to the terminal area T.

With this configuration, as shown in FIG. 3, the photo-curable adhesive sheet 70 is cured at the area overlapping the bent area of the flexible substrate 10, and the cured area 70b is thereby formed. In the first embodiment, the cured area 70b having high stiffness is formed to overlap the bent area of the flexible substrate 10. As such, the bent state of the flexible substrate 10 can be kept without using additional adhesive member, for example.

Figure 8:
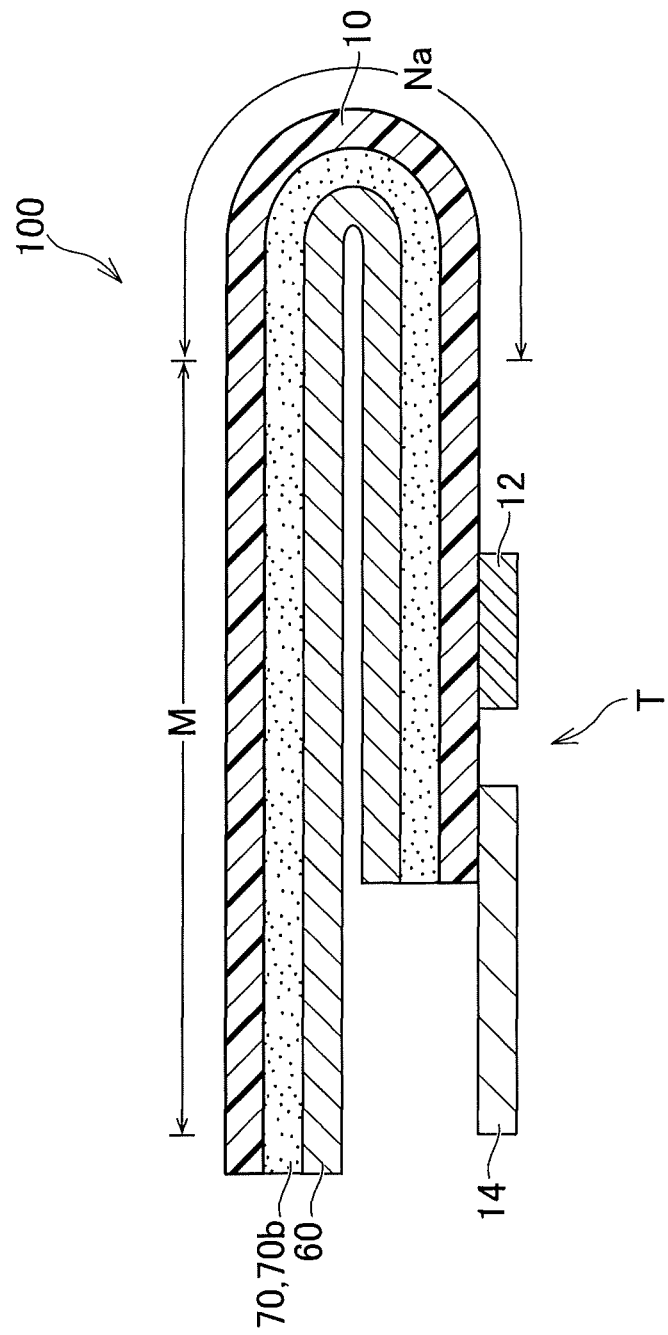
FIG. 8 is a schematic sectional view of the display device according to a first variation of the first embodiment illustrating an overall configuration of the display device.
Figure 9:
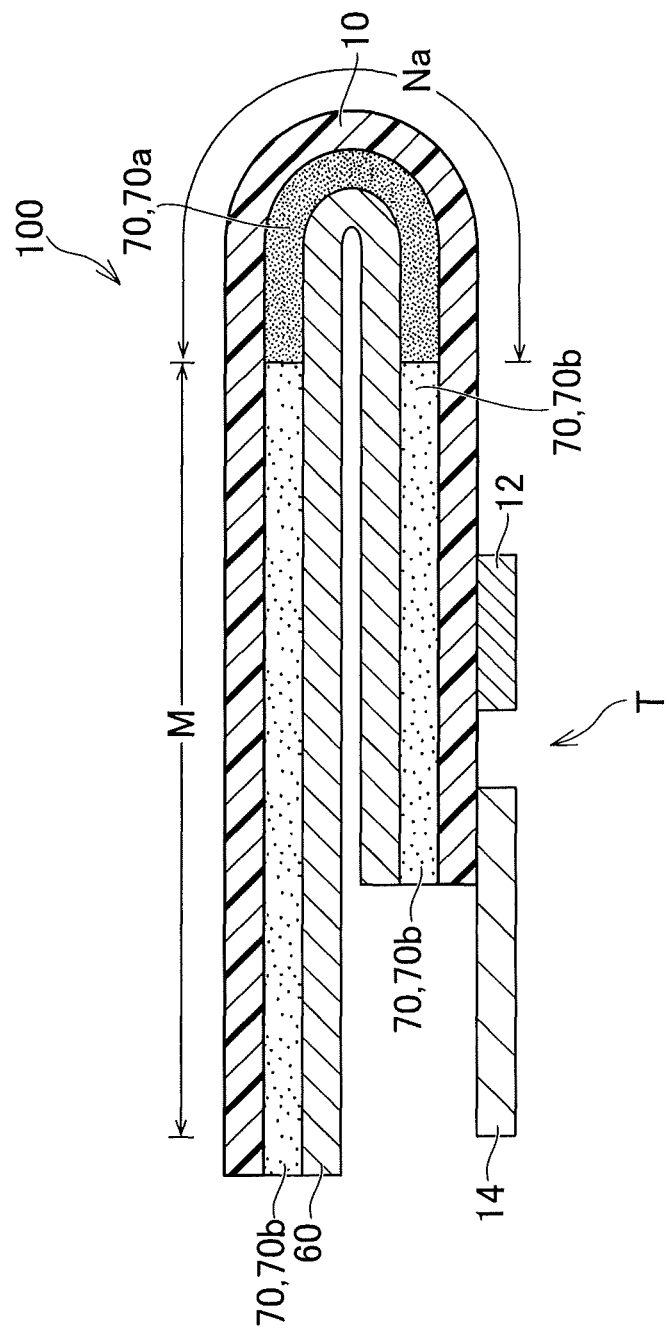
FIG. 9 is a schematic sectional view of the display device according to a second variation of the first embodiment illustrating an overall configuration of the display device.

If an adhesive member for bonding the flexible substrate 10 and the reinforcing film 60 together has thermosetting property, for example, it is difficult to partially cure the adhesive member. In the first embodiment, the adhesive member having ultraviolet curability is used, and thus the adhesive member can be partially cured. Further, as shown in FIG. 8, the entire photo-curable adhesive sheet 70 may be cured, or as shown in FIG. 9, the bent area may be a soft area 70a. In this way, a display device can be readily shaped when manufactured, and kept in a stable shape after being manufactured. Further, the soft area 70a is left in the bent area, which serves to provide functions to keep flexibility and reduce external impact.

Figure 10:
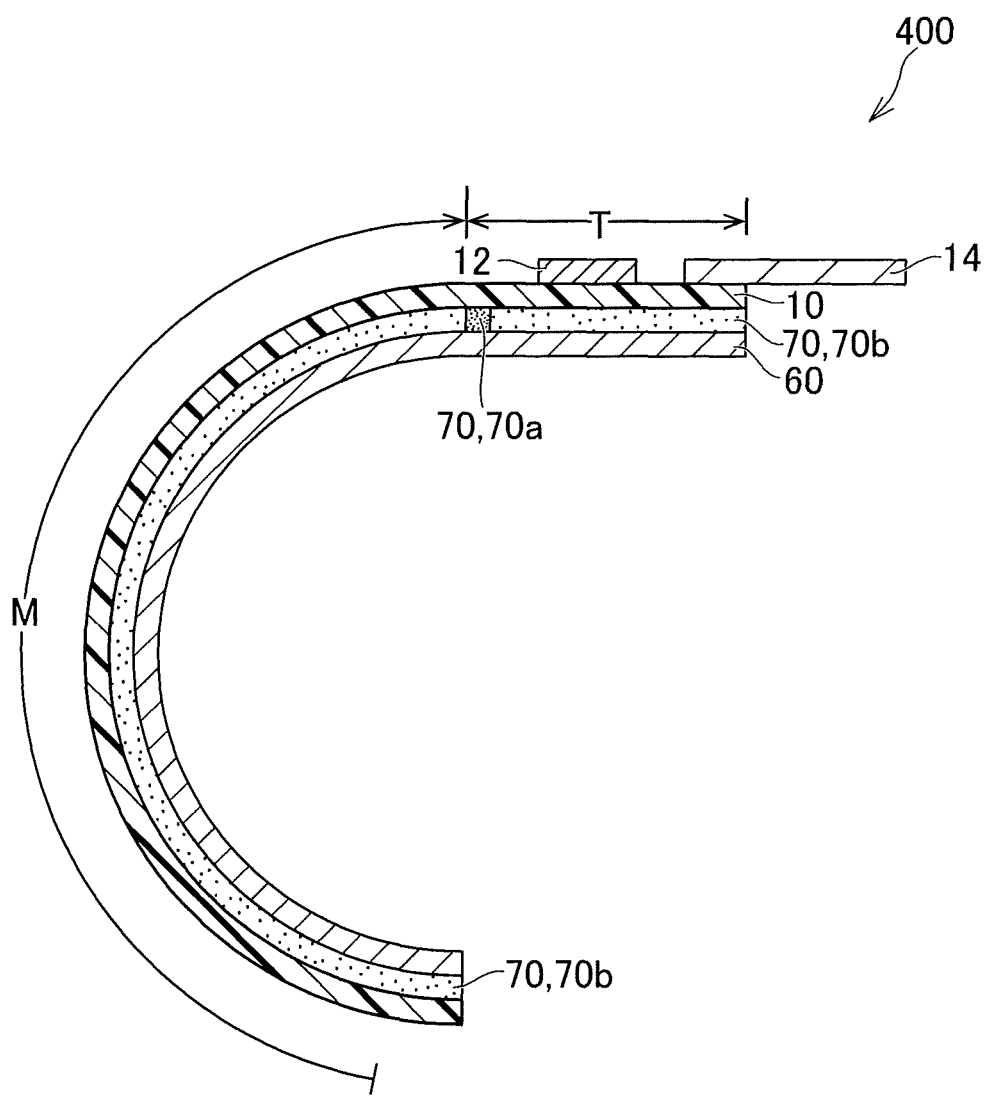
FIG. 10 is a schematic sectional view of the display device according to a second embodiment illustrating an overall configuration of the display device.
Figure 11:
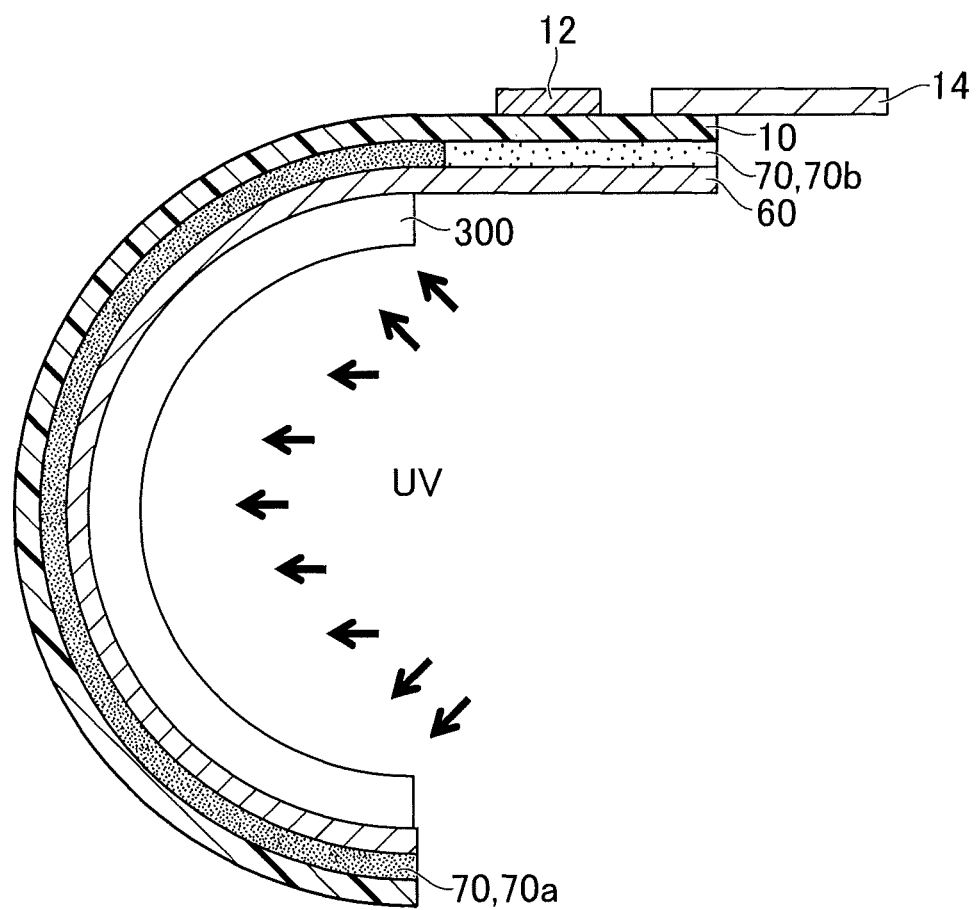
FIG. 11 is a schematic sectional view of the display device according to the second embodiment for explaining the manufacturing process of the display device.

Referring to FIGS. 10 and 11, a display device 400 according to second embodiment will be described. FIG. 10 is a schematic sectional view of the display device according to the second embodiment illustrating an overall configuration of the display device. FIG. 11 is a schematic sectional view of the display device according to the second embodiment for explaining the manufacturing process of the display device. The laminate structure on the flexible substrate 10 of the display device 400 is the same as the laminate structure on the flexible substrate 10 described in the first embodiment by referring to FIG. 2, and thus the explanation will be omitted. The elements that are the same as those of the display device 100 are labeled with the same numerals, and their overlapping explanation may be omitted.

The display device 400 is formed by bonding a reinforcing film 60 and a flexible substrate 10 having a display area M together by a photo-curable adhesive sheet 70. As shown in FIG. 10, the display device 400 is bent at the display area M. The photo-curable adhesive sheet 70 is irradiated with ultraviolet rays at an area that overlaps the bent display area M and an area that overlaps the terminal area T, and cured areas 70b are thereby generated.

In the display device 400, the cured area 70b having high stiffness is formed at the area that overlaps the bent area of the flexible substrate 10, and thus the flexible substrate 10 keeps the bent state without using a cover glass, for example, for keeping the bent shape. In addition, the cured area 70b (third cured area) having high stiffness is formed so as to overlap the display area M, and thus failures such as pixel damage unlikely occur in the display area M. Further, similarly to the first embodiment, the cured area 70b having high stiffness is formed so as to overlap the terminal area T, and thus improper mounting of the electronic components unlikely occurs.

Referring to FIG. 11, the manufacturing process of the display device 400 according to the second embodiment will be described. First, the flexible substrate 10 and the reinforcing film 60 are bonded together by the photo-curable adhesive sheet 70. Subsequently, ultraviolet rays are irradiated to the area that overlaps the terminal area T of the photo-curable adhesive sheet 70, thereby curing the photo-curable adhesive sheet 70 to form the cured area 70b. The electronic components such as the integrated circuit chip 12 and the flexible printed circuit substrate 14 are then mounted on the terminal area T. The photo-curable adhesive sheet 70 is cured at the area that overlaps the terminal area T, and thus the improper mounting of the electronic components also unlikely occurs as in the first embodiment.

As shown in FIG. 11, the flexible substrate 10, the reinforcing film 60, and the photo-curable adhesive sheet 70 are bent using a U-shaped jig 300 so as to be along the jig 300. The jig 300 may be formed of material having UV-transmitting properties.

Subsequently, ultraviolet rays are irradiated to the bent area of the photo-curable adhesive sheet 70 from the back side of the flexible substrate 10, thereby curing the photo-curable adhesive sheet 70 to form the cured area 70b. The photo-curable adhesive sheet 70 is cured while being bent, and thus the flexible substrate 10 and the reinforcing film 60 bonded together by the photo-curable adhesive sheet 70 keep the bent state. This keeps the display device 400 in the bent state even after the jig 300 is separated from the display device 400.

As described above, in the second embodiment, it is possible to provide a display device 400 having the flexible substrate 10, which is bent in the display surface of the display area M, without using an additional member, such as a cover glass for keeping the bent state of a product, in a finished state of the product. In other words, the bent shape can be maintained without increasing the number of members. As such, manufacturing costs can be reduced and a thin product can be provided. When keeping the bent state using a cover glass, a design of a product form is limited because a cover glass according to a bend amount needs to be prepared, for example. In a case where the bent shape is determined in accordance with the shape of the photo-curable adhesive sheet 70 as in the second embodiment, a product form may be determined in a more flexible manner.

In the second embodiment, an example will be described in which a part of the photo-curable adhesive sheet 70 is the soft area 70a, although the entire photo-curable adhesive sheet 70 may be the cured area 70b.

Figure 12:
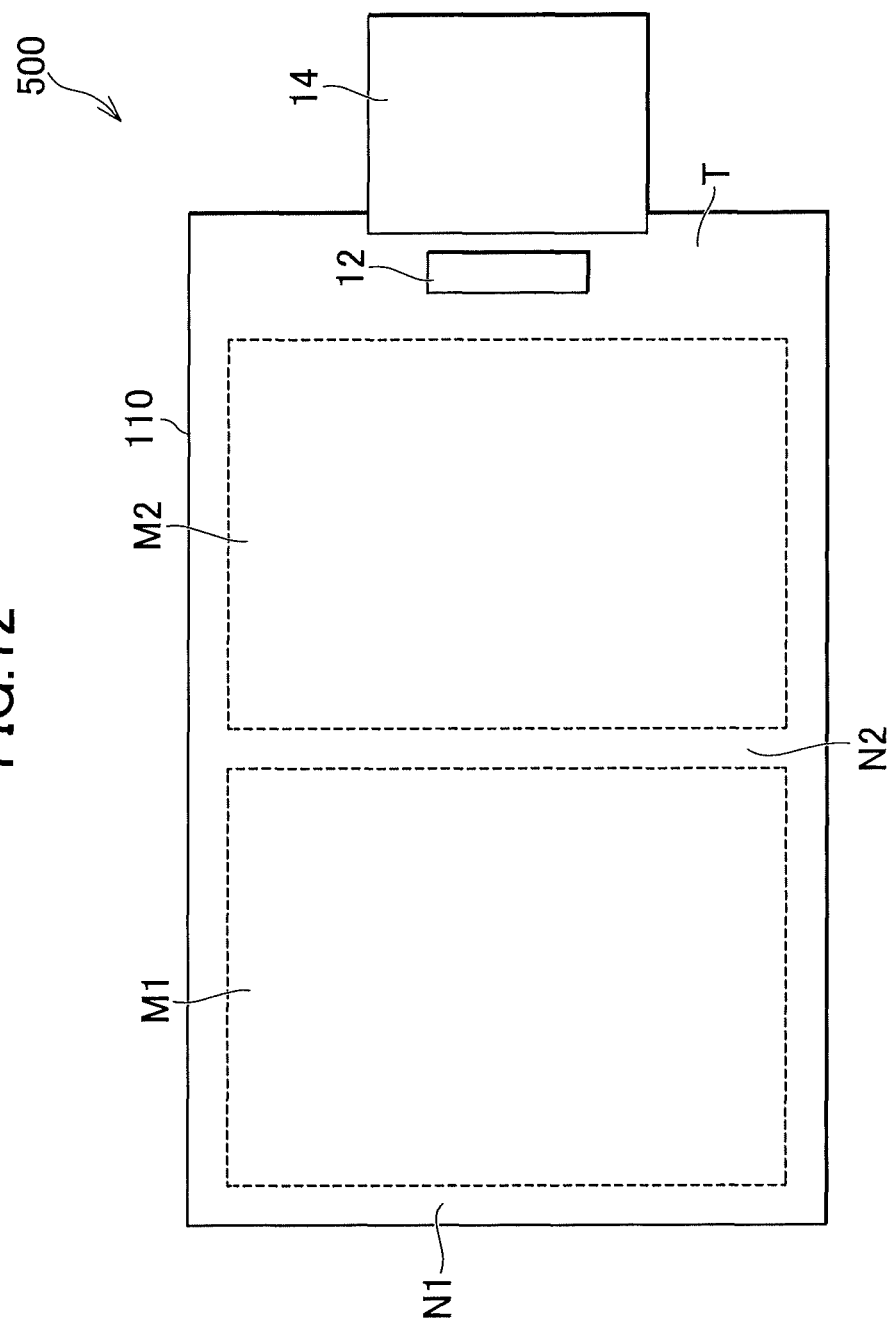
FIG. 12 is a plan view of the display device in a deployed state according to a third embodiment.
Figure 13:
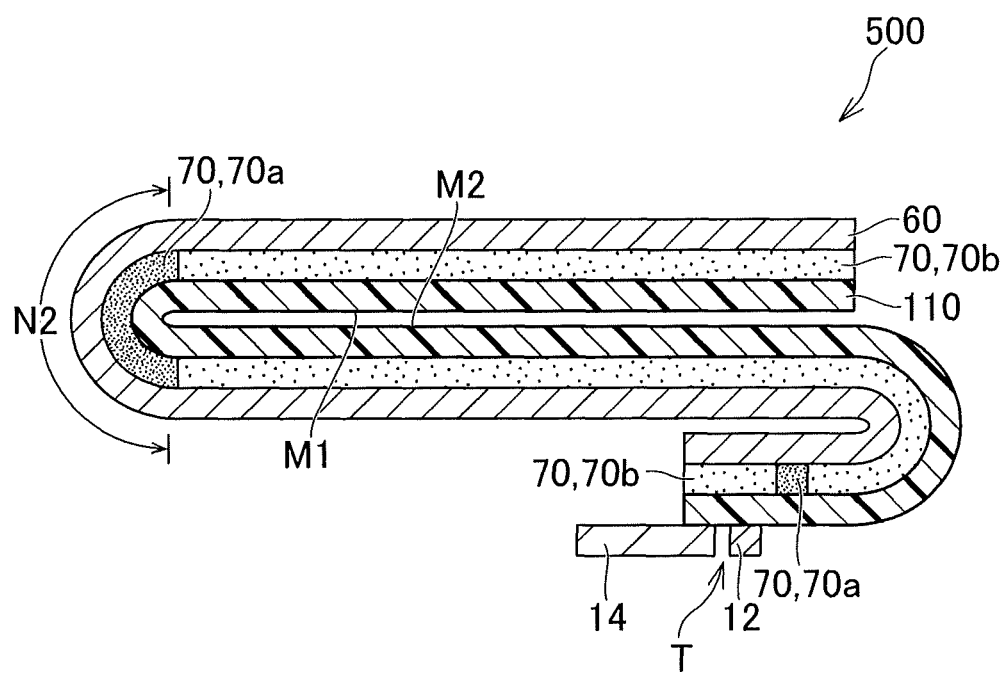
FIG. 13 is a schematic sectional view of the display device according to the third embodiment showing an example of use of the display device.
Figure 14:
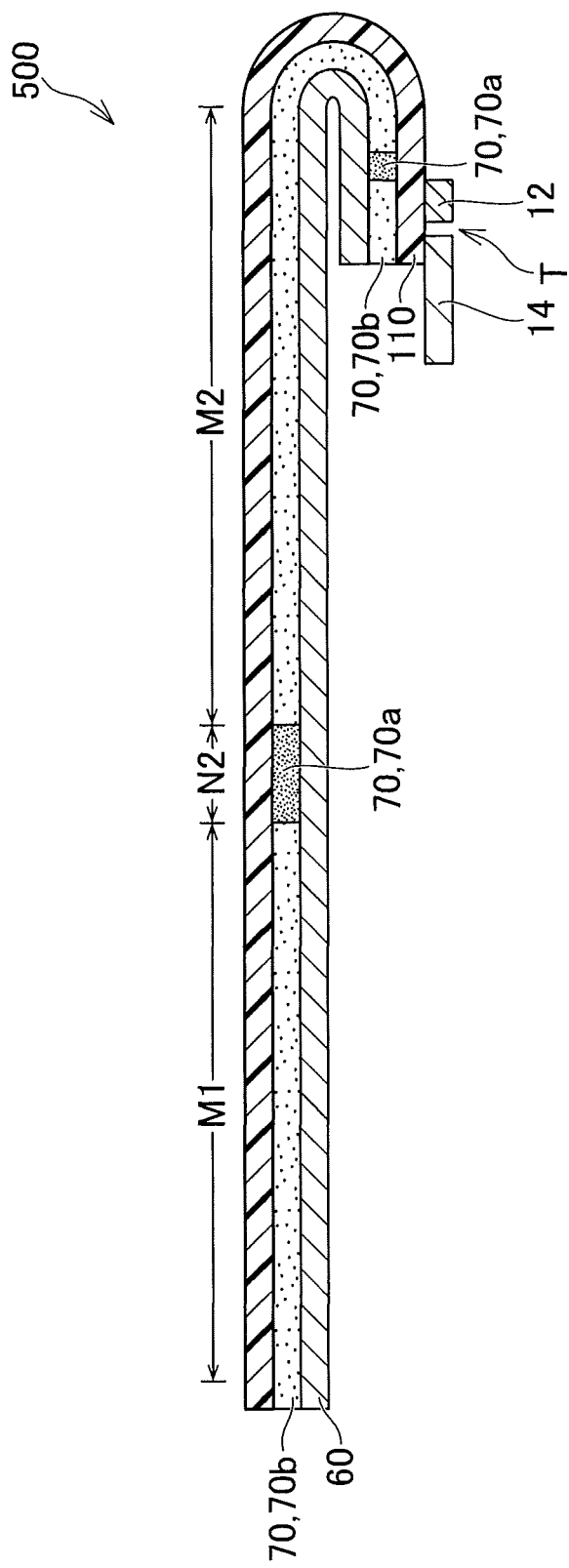
FIG. 14 is a schematic sectional view of the display device according to the third embodiment showing an example of use of the display device.
Figure 15:
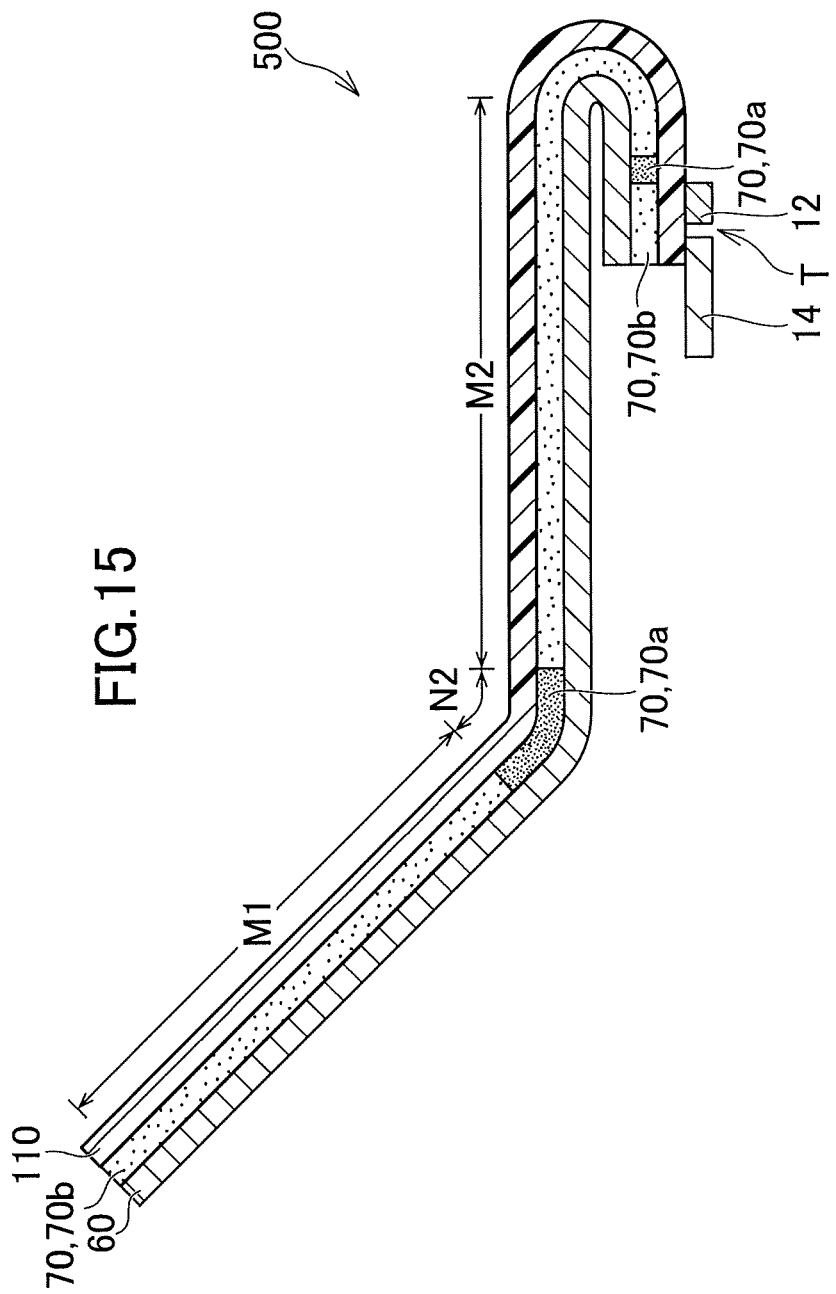
FIG. 15 is a schematic sectional view of the display device according to the third embodiment showing an example of use of the display device.

Referring to FIGS. 12 to 15, a display device 500 according to third embodiment will be described. FIG. 12 is a plan view of the display device in a deployed state according to the third embodiment. FIGS. 13 to 15 are schematic sectional views of the display device according to the third embodiment showing examples of the use of the display device. The laminate structure on a flexible substrate 110 of the display device 500 is the same as the laminate structure on the flexible substrate 10 described in the first embodiment referring to FIG. 2, and thus their overlapping explanation will be omitted. Elements that are the same or equivalent as the display device 100 are labeled with the same reference numerals and their explanation will be omitted.

The display device 500 includes the flexible substrate 110, a reinforcing film 60, and a photo-curable adhesive sheet 70 for bonding the flexible substrate 110 and the reinforcing film 60 together. As shown in FIG. 12, the flexible substrate 110 has a display area M1 and a display area M2. The flexible substrate 110 also includes a frame area N1 surrounding the outer edge of the flexible substrate 110, and a frame area N2 between the display area M1 and the display area M2. The flexible substrate 110 has a terminal area T on which electronic components are mounted. As shown in FIG. 13, for example, the flexible substrate 110 is bent so that the terminal area T is positioned at the back side of the display area M2. Pixels are not formed on the frame areas N1 and N2.

The cured areas 70b are areas of the photo-curable adhesive sheet 70 respectively overlapping the display area M1, the display area M2, and the terminal area T. The photo-curable adhesive sheet 70 has soft areas 70a overlapping at least the frame area N2. The cured areas 70b having high stiffness are formed on the areas that overlap the display area M1 and the display area M2, which serves to reduce the possibility of pixel damage.

The display device 500 is configured so as to be bendable at the frame area N2 of the flexible substrate 110. For example, when a user does not use the display device 500, as shown in FIG. 13, the frame area N2 can be in the bent state so that the display surface of the display area M1 opposes to the display surface of the display area M2. When the user sees the both of the display surface of the display area M1 and the display surface of the display area M2, the flexible substrate 110 may be in a deployed state as shown in FIG. 14, or the frame area N2 may be in the bent state so that the display surface of the display area M1 is inclined to the display surface of the display area M2 as shown in FIG. 15. In other words, it is possible to provide a display device that can be used by a user like a book. Such a configuration eliminates the need of combining a plurality of display devices, and thus costs can be reduced. Further, additional members at connecting parts are not required, for example, and thus costs and a size of the display device can be reduced. Further, a bent part may be provided only in an area corresponding to a blank space, and thus a size of a display part can be increased.

The above described embodiments explain the case where the reinforcing film 60 is adhered to the flexible substrate as a flexible film, although the present invention is not limited to this configuration. For example, if a liquid crystal display device is used as a display device, a film having a back-light function may be adhered to, as a flexible film, the back side of the display area of the flexible substrate by a photo-curable adhesive sheet.

In the above embodiments, the photo-curable adhesive sheet is used as a photo-curable adhesive member, although the scope of the present invention is not limited to this example of a sheet-like member. The flexible substrate and the flexible film may be bonded together by, for example, a resin having photo-curability.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
a flexible substrate including a display area on which a plurality of pixels are disposed, a frame area including a bent area in which the flexible substrate is bent, and a terminal area along an edge of the flexible substrate;
a flexible film; and a photo-curable adhesive member for bonding the flexible substrate and the flexible film together, wherein the bent area is between the display area and the terminal area, the photo-curable adhesive member includes a soft area and a hard area having higher hardness than the soft area, the hard area includes a first hard area which overlaps with the bent area and which does not overlap with the display area, and a second hard area which overlaps with the terminal area, and the first hard area and the second hard area are apart from each other.

2. The display device according to claim 1, wherein the soft area and the hard area are provided in a same layer.

3. The display device according to claim 1, wherein a modulus of elasticity of the soft area is 0.01 to 0.1 MPa.

4. The display device according to claim 1, wherein the photo-curable adhesive member is a sheet-like member including the soft area and the hard area.

5. The display device according to claim 1, wherein the first hard area extends along a bent axis of the bent area.

6. The display device according to claim 1, further comprising an electronic component, wherein the electronic component is mounted on the flexible substrate, at a part of the terminal area, and the electronic component, the flexible substrate, and the second hard area overlap each other.

7. The display device according to claim 1, wherein the hard area includes a third hard area formed on an area overlapping a part of the display area.

8. The display device according to claim 1, wherein the display device includes a frame area on which the plurality of pixels are not provided, the display area includes a first display area and a second display area that are provided so as to interpose the frame area therebetween, and the soft area is formed on an area overlapping the frame area between the first display area and the second display area.

9. The display device according to claim 1, wherein the flexible film is a reinforcing film for strengthening the flexible substrate.

10. The display device according to claim 1, wherein each of the plurality of pixels includes a light-emitting element.

11. The display device according to claim 1, wherein the flexible film has a back-light function.

12. The display device according to claim 1, wherein the soft area is between the first hard area and the second hard area.

13. A method for manufacturing a display device comprising steps of:

bonding a flexible substrate and a flexible film together by a photo-curable adhesive member, the flexible substrate including a display area; and curing a part of the photo-curable adhesive member by irradiating light, wherein the flexible substrate includes a display area on which a plurality of pixels are disposed, a frame area including a bent area in which the flexible substrate is bent, and a terminal area along an edge of the flexible substrate;

the photo-curable adhesive member includes a soft area and a hard area having higher hardness than the soft area, the hard area includes a first hard area which overlaps with the bent area and which does not overlap with the display area, and a second hard area which overlaps with the terminal area, and the bent area is between the display area and the terminal area, and the first hard area and the second hard area are apart from each other.

14. The method according to claim 13, further comprising a step of, after the step of curing the part of the photo-curable adhesive member, mounting an electronic component on a part of the terminal area on the flexible substrate, wherein the electronic component, the flexible substrate, and the second cured area overlap each other.

15. The method according to claim 13, further comprising a step of bending the flexible substrate, the flexible film, and the photo-curable adhesive member after the bonding step, wherein the photo-curable adhesive member is cured after bending the flexible substrate at the bent area, and the first hard area is formed in the cured photo-curable adhesive member.

16. The method according to claim 15, wherein in the bending step, a frame area on a periphery of the display area is bent.

17. The method according to claim 15, wherein the display area is bent in the bending step.

18. The method according to claim 13, wherein in the step of curing the part of the photo-curable adhesive member, the part overlapping the display area is cured.

19. The method according to claim 13, wherein in the step of curing the part of the photo-curable adhesive member, the photo-curable adhesive member is irradiated with ultraviolet rays.

20. The method according to claim 13, wherein the first hard area is configured to keep the bent shape of the flexible substrate.

* * * * *